(12) United States Patent
Taira et al.

(10) Patent No.: US 8,446,145 B2
(45) Date of Patent: May 21, 2013

(54) METHOD FOR MEASURING I-V CHARACTERISTICS OF SOLAR CELL, AND SOLAR CELL

(75) Inventors: Shigeharu Taira, Amagasaki (JP); Takeshi Nishiwaki, Kobe (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 772 days.

(21) Appl. No.: 12/700,910

(22) Filed: Feb. 5, 2010

(65) Prior Publication Data

US 2010/0201349 A1 Aug. 12, 2010

(30) Foreign Application Priority Data

Feb. 6, 2009 (JP) ................................. 2009-026640

(51) Int. Cl.
*G01R 1/06* (2006.01)
(52) U.S. Cl.
USPC ...... 324/149; 324/756.07; 324/715; 136/246; 136/256; 136/252; 257/E31.113; 438/98
(58) Field of Classification Search
USPC .................. 324/149, 756.07, 715; 136/246, 136/256, 252; 257/E31.113; 438/98
See application file for complete search history.

(56) References Cited

U.S. PATENT DOCUMENTS

| | | | | |
|---|---|---|---|---|
| 3,982,964 A | * | 9/1976 | Lindmayer et al. | 136/256 |
| 5,661,041 A | * | 8/1997 | Kano | 438/72 |
| 5,726,065 A | * | 3/1998 | Szlufcik et al. | 438/57 |
| 6,071,437 A | * | 6/2000 | Oya | 252/514 |
| 6,369,316 B1 | * | 4/2002 | Plessing et al. | 136/251 |
| 6,384,317 B1 | * | 5/2002 | Kerschaver et al. | 136/256 |
| 7,390,961 B2 | * | 6/2008 | Aschenbrenner et al. | 136/244 |
| 8,049,099 B2 | * | 11/2011 | Hishida et al. | 136/256 |
| 8,153,891 B2 | * | 4/2012 | Yoshimine et al. | 136/256 |

(Continued)

FOREIGN PATENT DOCUMENTS

| | | |
|---|---|---|
| EP | 2 056 355 A1 | 5/2009 |
| JP | 2006-118983 A | 5/2006 |
| WO | 2008/023795 A1 | 2/2008 |

OTHER PUBLICATIONS

Ohtsuka et al., "Improved Geometry of Heavily Diffused Emitters in High-Efficiency Silicon Solar Cells", Photovltaic Specialists Conference, 1996, pp. 517-520.*

(Continued)

*Primary Examiner* — Patrick Assouad
*Assistant Examiner* — Lamarr Brown
(74) *Attorney, Agent, or Firm* — Marvin A. Motsenbocker; MOTS Law, PLLC

(57) ABSTRACT

An aspect of the invention provides a method for measuring I-V characteristics of a solar cell, the solar cell comprising a plurality of fine line-shaped electrodes formed on a first surface in a predetermined direction; and a coupling line formed on the first surface that electrically couples at least two fine line-shaped electrodes among the plurality of fine line-shaped electrodes, the coupling line having a line width larger than a line width of the fine line-shaped electrodes. The method includes: contacting a probe pin for voltage measurement with the coupling line; contacting two or more probe pins for current measurement electrically connected to each other with two or more fine line-shaped electrodes including the fine line-shaped electrodes coupled to each other by the coupling line among the plurality of fine line-shaped electrodes; and measuring I-V characteristics while irradiating the first surface with light.

19 Claims, 6 Drawing Sheets

U.S. PATENT DOCUMENTS

| | | | |
|---|---|---|---|
| 8,299,350 B2 * | 10/2012 | Saita et al. | 136/244 |
| 2003/0000571 A1 * | 1/2003 | Wakuda et al. | 136/256 |
| 2005/0268959 A1 * | 12/2005 | Aschenbrenner et al. | 136/244 |
| 2006/0112987 A1 * | 6/2006 | Nakata et al. | 136/256 |
| 2007/0062574 A1 * | 3/2007 | Shiomi et al. | 136/256 |
| 2007/0074756 A1 * | 4/2007 | Yagiura et al. | 136/244 |
| 2007/0144578 A1 * | 6/2007 | Cunningham et al. | 136/256 |
| 2007/0163634 A1 * | 7/2007 | Wada et al. | 136/252 |
| 2007/0209697 A1 * | 9/2007 | Karakida et al. | 136/256 |
| 2007/0235077 A1 * | 10/2007 | Nagata et al. | 136/256 |
| 2007/0277810 A1 * | 12/2007 | Stock | 126/569 |
| 2008/0000519 A1 * | 1/2008 | Takahashi | 136/252 |
| 2008/0023068 A1 * | 1/2008 | Nakashima et al. | 136/256 |
| 2008/0023069 A1 * | 1/2008 | Terada et al. | 136/256 |
| 2008/0092942 A1 * | 4/2008 | Kinsey et al. | 136/252 |
| 2008/0156372 A1 * | 7/2008 | Wu et al. | 136/260 |
| 2008/0203965 A1 * | 8/2008 | Katoh et al. | 320/101 |
| 2008/0210298 A1 * | 9/2008 | Kuebelbeck et al. | 136/252 |
| 2008/0223429 A1 * | 9/2008 | Everett et al. | 136/244 |
| 2008/0230114 A1 * | 9/2008 | Nakatani et al. | 136/252 |
| 2008/0230115 A1 * | 9/2008 | Kannou et al. | 136/252 |
| 2008/0236649 A1 * | 10/2008 | Gibson et al. | 136/244 |
| 2008/0236662 A1 * | 10/2008 | Ichikawa et al. | 136/256 |
| 2008/0257399 A1 * | 10/2008 | Wong et al. | 136/246 |
| 2008/0283115 A1 * | 11/2008 | Fukawa et al. | 136/246 |
| 2008/0289689 A1 * | 11/2008 | Gibson | 136/258 |
| 2008/0295882 A1 * | 12/2008 | Stephens et al. | 136/244 |
| 2008/0302405 A1 * | 12/2008 | Intrieri | 136/246 |
| 2008/0302411 A1 * | 12/2008 | Nakahara et al. | 136/252 |
| 2008/0308148 A1 * | 12/2008 | Leidholm et al. | 136/256 |
| 2008/0314444 A1 * | 12/2008 | Kawaguchi | 136/256 |
| 2009/0044856 A1 * | 2/2009 | Yoshimine et al. | 136/256 |
| 2009/0078305 A1 * | 3/2009 | Nishiwaki | 136/249 |
| 2009/0126788 A1 * | 5/2009 | Hishida et al. | 136/256 |
| 2009/0194144 A1 * | 8/2009 | Taira et al. | 136/244 |
| 2009/0242013 A1 * | 10/2009 | Taguchi | 136/246 |
| 2010/0018577 A1 * | 1/2010 | Nishiwaki et al. | 136/256 |
| 2012/0167941 A1 * | 7/2012 | Taira | 136/244 |

OTHER PUBLICATIONS

Komatsu et al., "Application of Fine Electrode for High Efficiency mc-Si Solar Cells Over 18%", 3rd World Conference on Photovltaic Energy Converstion, May 2003, pp. 1459-1462.*

* cited by examiner

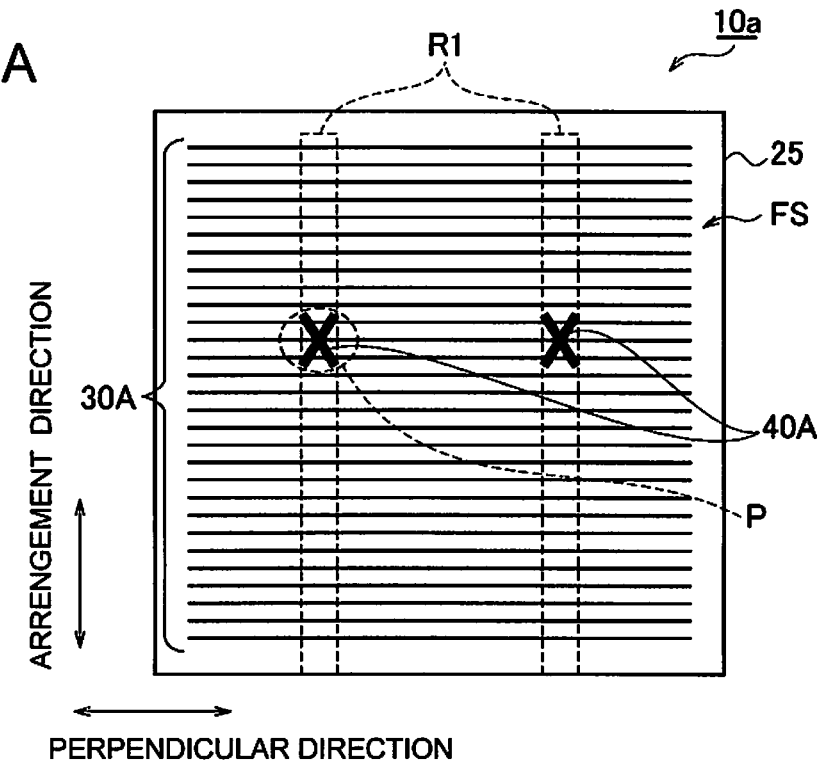
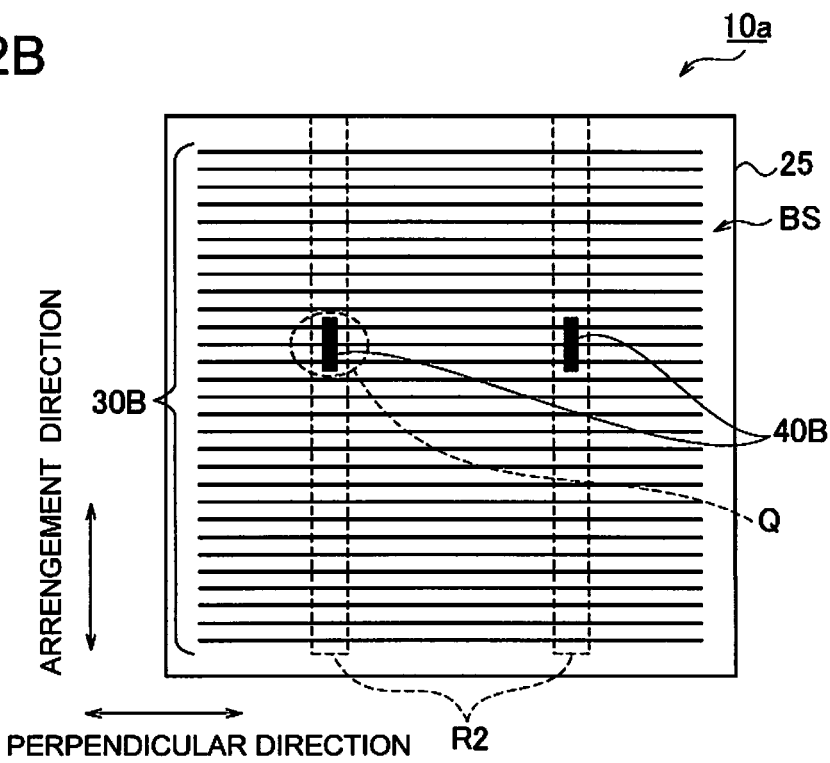

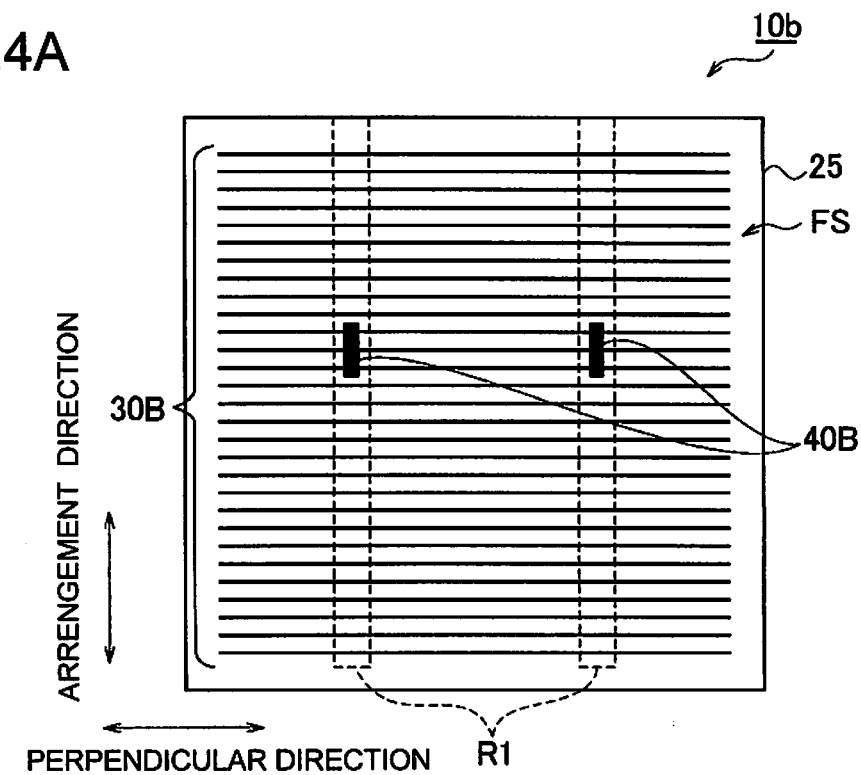
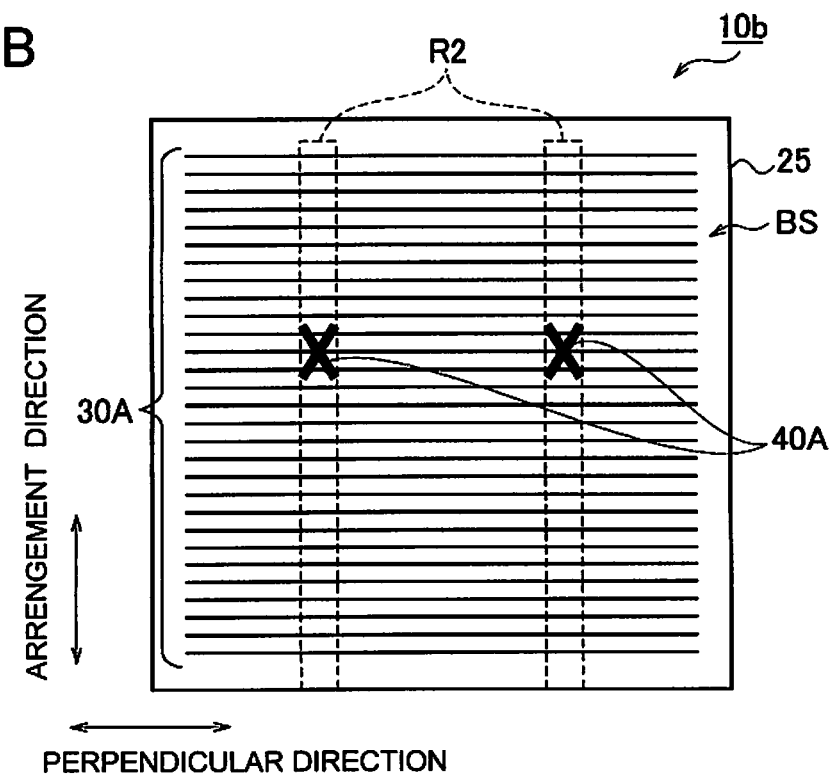

METHOD FOR MEASURING I-V CHARACTERISTICS OF SOLAR CELL, AND SOLAR CELL

CROSS REFERENCE TO RELATED APPLICATIONS

This application claims priority based on 35 USC 119 from prior Japanese Patent Application No. P2009-026640 filed on Feb. 6, 2009, entitled "METHOD FOR MEASURING I-V CHARACTERISTICS OF SOLAR CELL, AND SOLAR CELL", the entire contents of which are incorporated herein by reference.

BACKGROUND OF THE INVENTION

1. Field of the Invention

The invention relates to a method for measuring current-voltage "I-V" characteristics of a solar cell, and a solar cell.

2. Description of Related Art

Solar cells have been expected to be a new energy source, since the solar cells can directly convert clean and inexhaustibly supplied solar energy into electric energy.

In a manufacturing process of a solar cell, I-V characteristics of the solar cell are measured by the so-called four terminal measurement method (for example, see Japanese Patent Application Publication No. 2006-118983). Here, the four terminal measurement method is a measurement method using a plurality of probe pins for current measurement and one probe pin for voltage measurement, which contact with a collecting electrode, in each of a light receiving surface and a rear surface of the solar cell. Specifically, a relationship between current and voltage, when the voltage applied to the solar cell is swept is measured while the light receiving surface is irradiated with artificial sunlight. Thereby, the I-V characteristics of the solar cell are measured.

Here, the solar cell includes a plurality of fine line-shaped electrodes and a connection electrode intersecting the plurality of fine line-shaped electrodes as the collecting electrode on the light receiving surface. The connection electrode is an electrode for connecting a wiring member that connects solar cells to each other, and is formed wide. In such a solar cell, when the I-V characteristics are measured by the four terminal measurement method, what has to be done for performing the measurement is only to connect the plurality of probe pins for current measurement and the one probe pin for voltage measurement with the connection electrode.

Note that, the surface of the connection electrode becomes an equipotential surface by a voltage applied by the one probe pin for voltage measurement, and the probe pins for current measurement contacting the surface of the connection electrode are short-circuited to each other.

Conventionally, a proposal has been made of a first solar cell having only a plurality of fine line-shaped electrodes formed on a light receiving surface as a collecting electrode, and a second solar cell having a plurality of fine line-shaped electrodes and a coupling line formed on a light receiving surface, the coupling line having a thin line form and configured to couple the fine line-shaped electrodes to each other (see Internal Patent Application Publication No. WO 2008/023795). With such a solar cell, manufacturing cost of the solar cell can be reduced, because it is not necessary to form a wide connection electrode.

However, in the first solar cell, the fine line-shaped electrodes are not electrically connected to each other. Accordingly, even if one probe pin for voltage measurement applies the voltage to one fine line-shaped electrode, the surfaces of all of the fine line-shaped electrodes do not become equipotential surfaces.

Moreover, in a second solar cell, the coupling line has a thin line form, and electric resistance is large. For that reason, a potential difference is generated between the probe pin for voltage measurement and each of the probe pins for current measurement. As a result, there has been a problem that accuracy in measurement of the I-V characteristics of the solar cell is reduced.

The invention has been made in consideration of the circumstances mentioned above. An object of the invention is to provide a method for measuring I-V characteristics of a solar cell and a solar cell that can improve accuracy of measurement.

SUMMARY OF THE INVENTION

An aspect of the invention provides a method for measuring I-V characteristics of a solar cell, the solar cell comprising a plurality of fine line-shaped electrodes formed on a first surface in a predetermined direction; and a coupling line formed on the first surface that electrically couples at least two fine line-shaped electrodes among the plurality of fine line-shaped electrodes, the coupling line having a line width larger than a line width of the fine line-shaped electrodes. The method includes: contacting a probe pin for voltage measurement with the coupling line; contacting two or more probe pins for current measurement electrically connected to each other with two or more fine line-shaped electrodes including the fine line-shaped electrodes coupled to each other by the coupling line among the plurality of fine line-shaped electrodes; and measuring I-V characteristics while irradiating the first surface with light.

Another aspect of the invention provides a solar cell connected to a wiring member that comprises: a first surface; a plurality of fine line-shaped electrodes formed on the first surface and extending in a predetermined direction; a coupling line formed on the first surface that electrically couples at least two fine line-shaped electrodes among the plurality of fine line-shaped electrodes, a line width of the fine line-shaped electrode being larger than a line width of the connection line; and a connection line formed on the first surface that electrically connects the plurality of fine line-shaped electrodes to each other.

Still another aspect of the invention provides a solar cell that comprises: a first fine line-shaped electrode group including a plurality of fine line-shaped electrodes formed on a first surface of the solar cell to extend in a predetermined direction; and a first coupling line formed on the first surface to electrically couple at least two fine line-shaped electrodes of the first fine line-shaped electrode group, a line width of the first coupling line being larger than a line width of the fine line-shaped electrodes.

BRIEF DESCRIPTION OF THE DRAWINGS

FIG. 2 is a plan view of a first solar cell according to the first embodiment;

FIG. 4 is a plan view of a second solar cell according to the first embodiment;

DETAILED DESCRIPTION OF EMBODIMENTS

Figure 1:
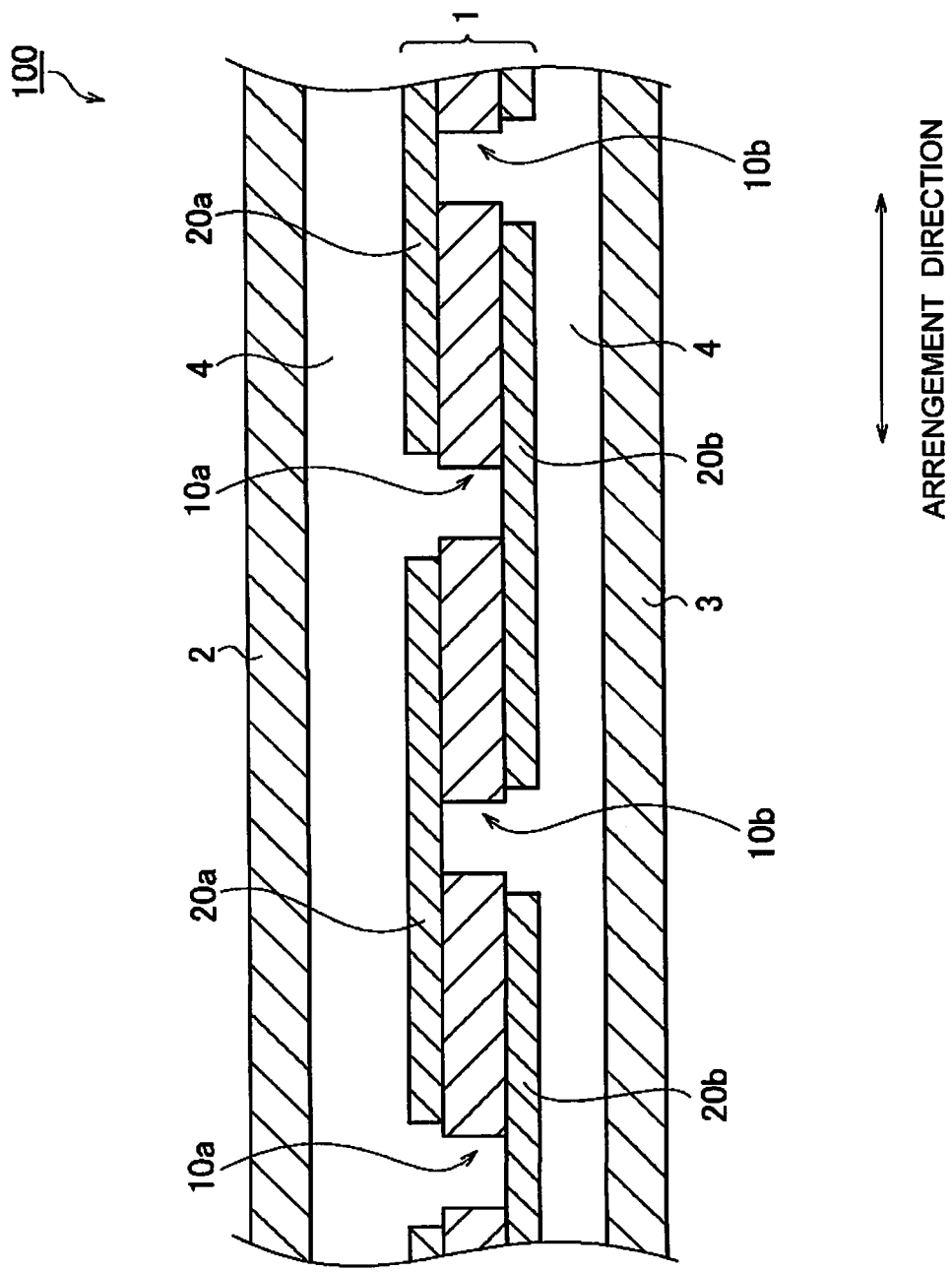
FIG. 1 is a side view of a solar cell module according to a first embodiment.

Descriptions are provided hereinbelow for embodiments based on the drawings. In the respective drawings referenced herein, the same constituents are designated by the same reference numerals and duplicate explanation concerning the same constituents is basically omitted. All of the drawings are provided to illustrate the respective examples only. No dimensional proportions in the drawings shall impose a restriction on the embodiments. For this reason, specific dimensions and the like should be interpreted with the following descriptions taken into consideration. In addition, the drawings include parts whose dimensional relationship and ratios are different from one drawing to another.

Prepositions, such as "on", "over" and "above" may be defined with respect to a surface, for example a layer surface, regardless of that surface's orientation in space. The preposition "above" may be used in the specification and claims even if a layer is in contact with another layer. The preposition "on" may be used in the specification and claims when a layer is not in contact with another layer, for example, when there is an intervening layer between them.

[First Embodiment]
(Schematic Configuration of Solar Cell Module)

A schematic configuration of solar cell module 100 according to a first embodiment of the invention is described with reference to FIG. 1. FIG. 1 is a side view of solar cell module 100 according to the first embodiment.

Solar cell module 100 includes solar cell string 1, light receiving surface member 2, rear surface member 3, and sealing material 4. Solar cell module 100 is configured by sealing solar cell string 1 between light receiving surface member 2 and rear surface member 3.

Solar cell string 1 is configured by connecting a plurality of solar cells 10 arranged in an arrangement direction to each other by a plurality of wiring members 20.

Multiple solar cells 10 each have light receiving surface FS from which sunlight enters, and rear surface BS provided on the opposite surface of the light receiving surface (see FIGS. 2 and 4). Light receiving surface FS and rear surface BS are the main surfaces of each solar cell 10. Multiple solar cells 10 include first solar cells 10A and second solar cells 10B. First solar cells 10A and second solar cells 10B are alternately arranged in the arrangement direction. Although first solar cells 10A and second solar cells 10B each have the same configuration, light receiving surface FS of each if first solar cells 10A has a polarity different from that of each of second solar cells 10B. Specifically, while a p type main surface a is light receiving surface FS in first solar cell 10A, an n type main surface is a light receiving surface FS in second solar cell 10B.

Configuration of each of first solar cells 10A and second solar cells 10B is described later.

Each of the plurality of wiring members 20 electrically connects two adjacent solar cells 10 to each other. Multiple wiring members 20 include first wiring members 20A and second wiring members 20B. Each first wiring member 20A is connected to the light receiving surface of one of first solar cells 10A and that of adjacent second solar cell 10B. Each second wiring member 20B is connected to the rear surface of one of first solar cells 10A and that of adjacent second solar cell 10B. Preferably, each wiring member 20 is made of a material having a lower electric resistance, such as copper, silver, gold, tin, nickel, aluminum, or alloys of these materials, and formed into a thin plate shape or a twisted line shape. A conductive material such as lead free solder (for example, $SnAg_{3.0}Cu_{0.5}$) may be plated onto the surface of each wiring member 20.

Light receiving surface side protective member 2 is disposed on the light receiving surface side of sealing material 4 to protect the front surface of solar cell module 100. As light receiving surface member 2, a member having translucency and waterproof properties such as glass and translucent plastics can be used.

Back surface side protective member 3 is disposed on the rear surface side of sealing material 4 to protect the rear surface of solar cell module 100. As rear surface member 3, a resin film such as PET (Polyethylene Terephthalate), a laminated film having a structure in which an Al foil is sandwiched between resin films, and the like can be used.

Sealing material 4 seals solar cell string 1 between light receiving surface member 2 and rear surface member 3. As sealing material 4, translucent resins such as EVA, EEA, PVB, silicon, urethane, acrylic, and epoxy, can be used.

An Al frame or the like may be attached to an outer circumference of solar cell module 100 having the above configuration.

In FIG. 1, the light receiving surface FS of each of first solar cells 10A has a polarity different from that of each of second solar cells 10B. It is not limited to this configuration. The light receiving surface FS of each of first solar cells 10A may have a same polarity as that of each of second solar cells 10B.

(Configuration of First Solar Cell)

Next, a configuration of each of first solar cells 10A according to the first embodiment is described with reference to FIGS. 2A and 2B. FIG. 2A is a plan view of first solar cell 10A observed from the light receiving side. FIG. 2B is a plan view of first solar cell 10A observed from the rear surface side.

As shown in FIGS. 2A and 2B, first solar cell 10A includes photoelectric conversion body 25, a plurality of first fine line-shaped electrodes 30A, a plurality of second fine line-shaped electrodes 30B, first coupling lines 40A, and second coupling lines 40B.

Photoelectric converter 25 has a p type main surface and an n type main surface. In first solar cell 10A, the p type main surface is set as light receiving surface FS, and the n type main surface is set as rear surface BS. First wiring member 20A is connected to connection region R1 in the light receiving surface FS, and second wiring member 20B is connected to connection region R2 in rear surface BS.

Photoelectric converter 25 produces light generated carriers by receiving light on light receiving surface FS. Here, the light generated carriers refer to electron holes and electrons generated by absorption of the sunlight by photoelectric conversion body 25. Photoelectric converter 25 has an n type region and a p type region, and a semiconductor junction is formed at an interface between the n type region and the p type region. Photoelectric converter 25 can be formed using a semiconductor substrate made of crystal based semiconductor materials such as monocrystalline Si and polycrystalline Si, compound semiconductor materials such as GaAs, and InP, and the like. Photoelectric converter 25 may have the so-called HIT structure, namely, a structure in which characteristics of a heterojunction interface are improved by sandwiching a substantially intrinsic amorphous silicon layer between a monocrystalline silicon substrate and an amorphous silicon layer.

First fine line-shaped electrode 30A is a collection electrode configured to collect electron holes from photoelectric conversion body 25. As shown in FIG. 2A, first fine line-shaped electrode 30A is formed on the p type main surface (light receiving surface FS) and extends in a perpendicular direction which is a direction approximately perpendicular to the arrangement direction. First fine line-shaped electrode 30A may be directly connected to first wiring member 20A in connection region R1, or may be electrically connected to first wiring member 20A with an electroconductive adhesive. First fine line-shaped electrode 30A can be formed by printing a conductive paste or the like.

Second fine line-shaped electrode 30B is a collection electrode configured to collect the electrons from photoelectric conversion body 25. As shown in FIG. 2B, second fine line-shaped electrode 30B is formed in the perpendicular direction on the n type main surface (rear surface BS). Second fine line-shaped electrode 30B may be directly connected to second wiring member 20B in connection region R2, or may be electrically connected to second wiring member 20B with an electroconductive adhesive. Second fine line-shaped electrode 30B can be formed by printing the same conductive paste as that of first fine line-shaped electrode 30A or the like. The number and shape of the collection electrode on the rear surface side is not limited in the invention. The collection electrode on the rear surface side may be formed, for example, so that the entire rear surface BS is covered.

Each of first coupling lines 40A electrically couples the plurality of first fine line-shaped electrodes 30A on the p type main surface (light receiving surface FS). Specifically, first coupling line 40A couples three of first fine line-shaped electrodes 30A in connection region R1 by intersecting these three of first fine line-shaped electrodes 30A. First coupling line 40A may be directly connected to first wiring member 20A, or may be electrically connected to first wiring member 20A with an electroconductive adhesive. First coupling line 40A can be formed by printing the same conductive paste as that of first fine line-shaped electrode 30A, or the like.

Each of Second coupling lines 40B electrically couples the plurality of second fine line-shaped electrodes 30B on the n type main surface (rear surface BS). In this embodiment, second coupling line 40B couples three of second fine line-shaped electrodes 30B in connection region R2 by intersecting these three of second fine line-shaped electrodes 30B. Second coupling line 40B may be directly connected to second wiring member 20B, or may be electrically connected to second wiring member 20B with an electroconductive adhesive. Second coupling line 40B can be formed by printing the same conductive paste as that of first fine line-shaped electrode 30A, or the like.

As described later, first coupling lines 40A and second coupling lines 40B are used to form the equipotential surface on first fine line-shaped electrode 30A and second fine line-shaped electrode 30B in a measuring process of the I-V characteristics of first solar cell 10A.

Figure 3A:
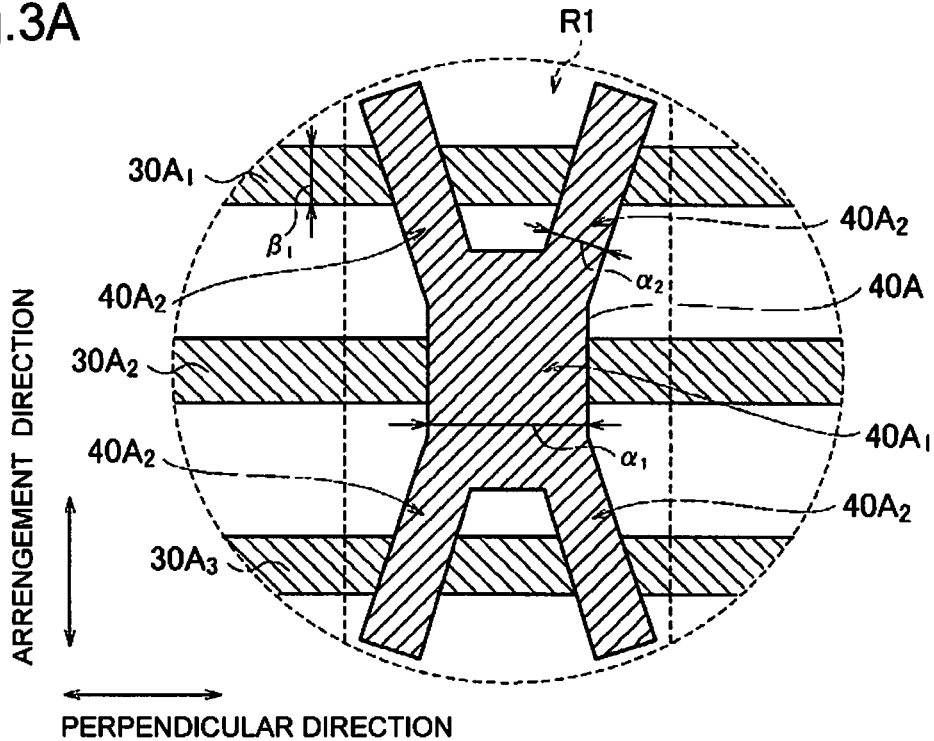
FIG. 3 is a diagram showing a configuration of a coupling line according to the first embodiment.
Figure 3B:
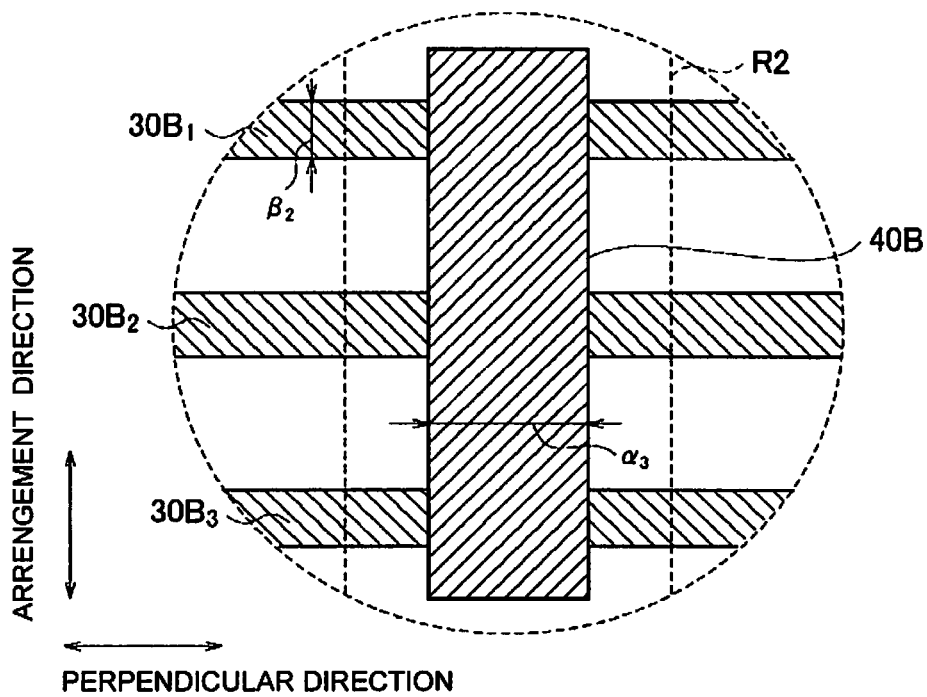

FIG. 3A is a partially enlarged view showing configurations of one of first coupling lines 40A, and FIG. 3B is a partially enlarged view showing configurations of one of second coupling lines 40B. Specifically, FIG. 3A is an enlarged view of a P portion in FIG. 2A, and FIG. 3B is an enlarged view of a Q portion in FIG. 2B.

First coupling line 40A intersects three first fine line-shaped electrodes $30A_1$ to $30A_3$, and electrically connects the three first fine line-shaped electrodes $30A_1$ to $30A_3$ to each other. Both ends of first coupling line 40A are branched into two in the arrangement direction, and first coupling line 40A has trunk $40A_1$ and four branches $40A_2$.

Moreover, second coupling line 40B intersects three second fine line-shaped electrodes $30B_1$ to $30B_3$, and electrically connects the three second fine line-shaped electrodes $30B_1$ to $30B_3$ to each other. Second coupling line 40B is formed in the arrangement direction.

As described above, a planar shape of first coupling line 40A and that of second coupling line 40B differ from each other. Specifically, while the planar shape of first coupling line 40A is an "X-like" shape, the planar shape of second coupling line 40B is a "rectangular shape."

Here, a line width of first coupling line 40A is larger than that of first fine line-shaped electrode 30A. Moreover, a line width of second coupling line 40B is larger than that of second fine line-shaped electrode 30B. Specifically, line width $\alpha_1$ of trunk $40A_1$ of first coupling line 40A (for example, 0.5 mm) is larger than line width $\alpha_2$ of branch $40A_2$ (for example, 0.25 mm). Line width $\alpha_2$ of branch $40A_2$ is larger than line width $\beta_1$ of first fine line-shaped electrode 30A (for example, 0.1 mm). Moreover, line width $\alpha_3$ of second coupling line 40B (for example, 0.5 mm) is larger than line width $\beta_2$ of second fine line-shaped electrode 30B (for example, 0.1 mm).

(Configuration of Second Solar Cell)

Next, a configuration of each of second solar cells 10B according to the first embodiment is described with reference to FIGS. 4A and 4B. FIG. 4A is a plan view of second solar cell 10B observed from the light receiving surface side. FIG. 4B is a plan view of second solar cell 10B observed from the rear surface side.

Similar to first solar cell 10A, second solar cell 10B includes photoelectric conversion body 25, a plurality of first fine line-shaped electrodes 30A, a plurality of second fine line-shaped electrodes 30B, first coupling lines 40A, and second coupling lines 40B.

However, it should be noted that, in second solar cell 10B, the n type main surface is set as light receiving surface FS, and the p type main surface is set as rear surface BS. Namely, in second solar cell 10B, photoelectric conversion body 25 is turned over. For that reason, first coupling line 40A having an X-like shape is exposed on light receiving surface FS in first solar cell 10A, while second coupling line 40B having a rectangular shape is exposed on light receiving surface FS in second solar cell 10B.

(Method for Manufacturing Solar Cell Module)

Next, a method for manufacturing solar cell module 100 according to this embodiment is described.

(1) Process of Forming Solar Cell

First, a plurality of photoelectric conversion bodies each having the p type main surface and the n type main surface are prepared.

Next, a silver paste or the like is applied on both main surfaces of the photoelectric conversion bodies in a predetermined pattern by using a printing technique such as a screen printing or offset printing. The predetermined pattern is the pattern shown in FIG. 2A and FIG. 4B in case of the p type main surface of the photoelectric conversion body, and is the pattern shown in FIG. 2B and FIG. 4A in case of the n type main surface of the photoelectric conversion body.

Next, the silver paste is dried under a predetermined condition, and thus a plurality of solar cells 10 are formed. First solar cell 10A has the p type main surface as light receiving surface FS, and second solar cell 10B has the n type main surface as light receiving surface FS.

(2) Measurement of I-V Characteristics of Solar Cell

Next, the I-V characteristics of each of solar cells 10 are measured. Hereinafter, description is given of a measurement method of the I-V characteristics, and as an example of the method, a so-called "four terminal measurement method" is described.

Figure 5:
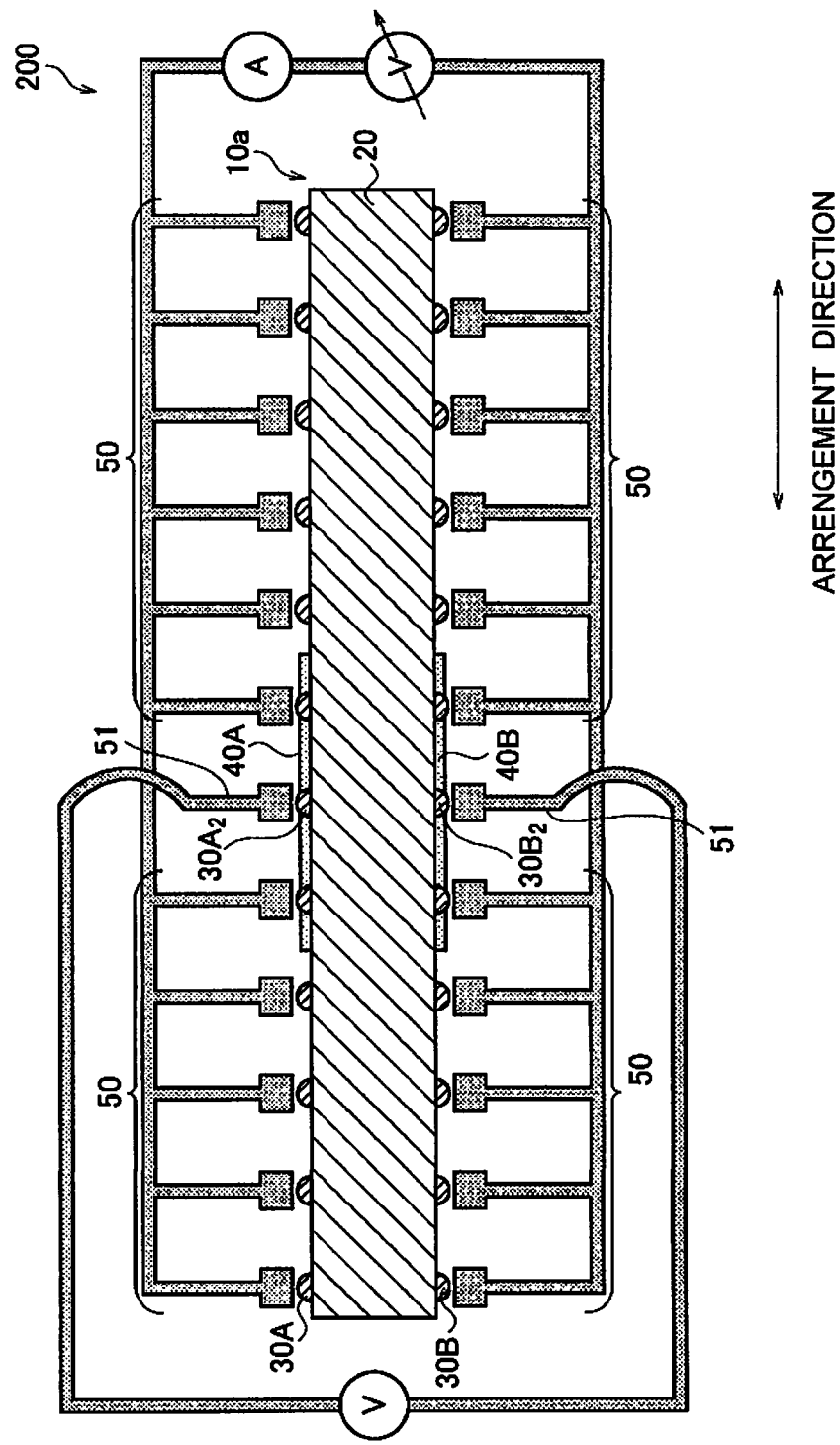
FIG. 5 is a schematic view for describing a method for measuring I-V characteristics according to the first embodiment.

FIG. 5 is a schematic view of I-V characteristics measuring apparatus 200. As shown in FIG. 5, I-V characteristics measuring apparatus 200 includes a group of pairs of probe pins 50, 50, . . . for current measurement and a pair of probe pins 51 and 51 for voltage measurement.

First, the group of pairs of probe pins 50, 50, . . . for current measurement is contacted with a plurality of first fine line-shaped electrodes 30A (except first fine line-shaped electrode $30A_2$) and a plurality of second fine line-shaped electrodes 30B (except second fine line-shaped electrode $30B_2$). Moreover, the pair of probe pins 51 and 51 for voltage measurement is contacted with first coupling line 40A and second coupling line 40B. Line width $A_1$ of first coupling line 40A is wider than line width $\beta_1$ of first fine line-shaped electrode 30A, and line width $\alpha_3$ of second coupling line 40B is wider than line width $\beta_2$ of second fine line-shaped electrode 30B.

Here, probe pin 51 for voltage measurement contacted with first fine line-shaped electrode $30A_2$ is electrically connected to other first fine line-shaped electrodes 30A through first coupling line 40A and the group of probe pins 50, 50, . . . for current measurement. Moreover, probe pin 51 for voltage measurement contacted with second fine line-shaped electrode $30B_2$ is electrically connected to other second fine line-shaped electrodes 30B through second coupling line 40B and the group of probe pins 50, 50, . . . for current measurement.

Next, a voltage is applied to first fine line-shaped electrode $30A_2$ and second fine line-shaped electrode $30B_2$ from the pair of probe pins 51 and 51 for voltage measurement while solar cell 10 is irradiated with artificial sunlight. At this time, the equipotential surface is formed on each surface of the plurality of first fine line-shaped electrodes 30A by probe pin 51 for voltage measurement. Similarly, the equipotential surface is formed also on each surface of the plurality of second fine line-shaped electrodes 30B by probe pin 51 for voltage measurement.

Thereafter, the I-V characteristics of each of solar cells 10 is calculated by measuring a current and a voltage while an applied voltage is swept.

Then, solar cell 10 showing undesirable I-V characteristics is removed, and the method for manufacturing goes to the next process.

(3) Process of Forming Solar Cell String

Next, first solar cells 10A and second solar cells 10B are arranged alternately in the arrangement direction. Then, it is checked that each of solar cells 10 has the planar shape of the coupling line different from that of adjacent solar cell 10.

Then, each of first wiring members 20A is connected to the light receiving surface of corresponding first solar cell 10A and to the light receiving surface of corresponding second solar cell 10B. Moreover, each of second wiring members 20B is connected to the rear surface of corresponding first solar cell 10A and to the rear surface of corresponding second solar cell 10B. At this time, the electrodes and the coupling lines may be directly connected to wiring members 20 by pushing first wiring members 20A and second wiring members 20B. A thermosetting resin adhesive, solder, and the like can be used for connection of wiring members 20.

(4) Modularization Process

Next, a laminated body is formed by sequentially laminating an EVA (sealing material 4) sheet, solar cell string 1, an EVA (sealing material 4) sheet, and a PET sheet (rear surface member 3) on a glass substrate (light receiving surface member 2).

Thereafter, the EVA is hardened by heating the above-mentioned laminated body under a predetermined condition. Thereby, solar cell module 100 is produced. A terminal box, an Al frame, and the like can be attached to solar cell module 100.

(Action and Effect)

In this embodiment, the method for measuring the I-V characteristics of each of solar cells 10 includes: the process of contacting probe pin 51 for voltage measurement with first coupling line 40A; the process of contacting two or more probe pins 50, 50, . . . for current measurement electrically connected to each other with two or more fine line-shaped electrodes including the fine line-shaped electrodes coupled by first coupling line 40A among the plurality of first fine line-shaped electrodes 30A; and the process of applying voltage to first coupling line 40A by probe pin 51 for voltage measurement while light receiving surface FS is irradiated with light.

Here, because the line width of first coupling line 40A is larger than that of first fine line-shaped electrode 30A, electric resistance among three first fine line-shaped electrodes $30A_1$ to $30A_3$ is sufficiently small. Accordingly, it is possible to suppress generation of a potential difference between probe pin 51 for voltage measurement and the group of probe pins 50, 50, . . . for current measurement. As a result, accuracy in measurement of the solar cell characteristics of each of first solar cells 10A can be improved.

Moreover, in this embodiment, first coupling lines 40A are formed in connection regions R1. Therefore, it is possible to avoid reduction in a light receiving surface area.

The above-mentioned effect can be similarly obtained by second coupling lines 40B included in first solar cells 10A according to the first embodiment.

In this embodiment, the planar shape of first coupling line 40A is different from that of second coupling line 40B. Accordingly, it is possible to easily check that first solar cells 10A having the p type main surface as light receiving surface FS and second solar cells 10B having the n type main surface as light receiving surface FS are arranged alternately. As a result, the productivity of solar cell module 100 can be improved.

[Second Embodiment]

Hereinafter, a second embodiment of the invention is described with reference to the drawings. Differences from the first embodiment mentioned above are mainly described. Specifically, in the second embodiment, plurality of first fine line-shaped electrodes 30A and the plurality of second fine line-shaped electrodes 30B are electrically connected to each other.

(Configuration of First Solar Cell)

Figure 6A:
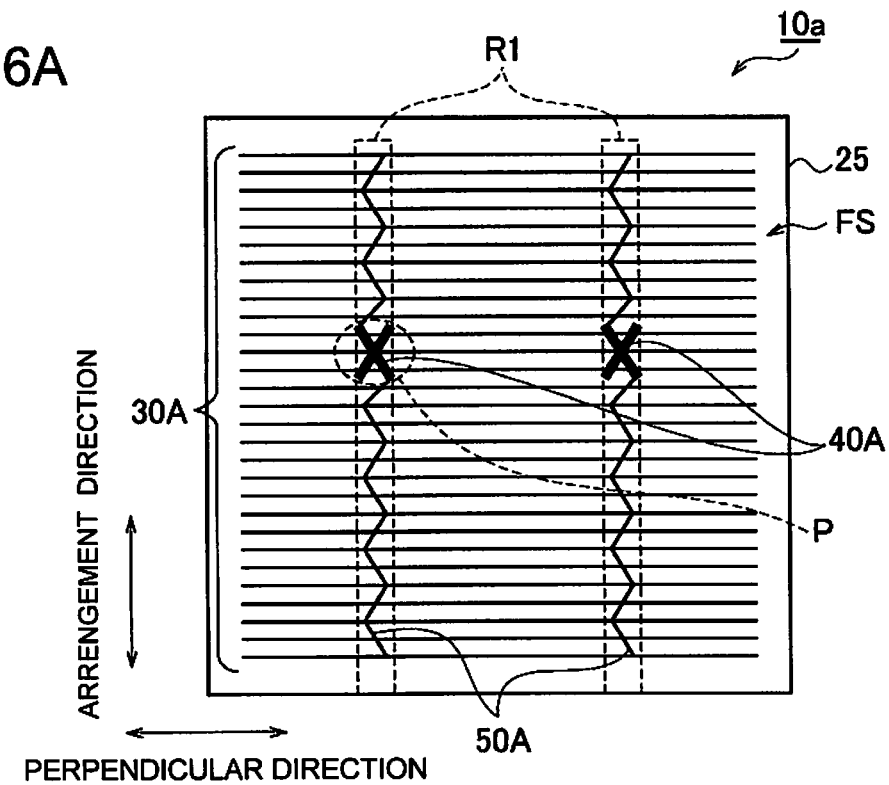
FIG. 6 is a plan view of first solar cell 10 according to the second embodiment.
Figure 6B:
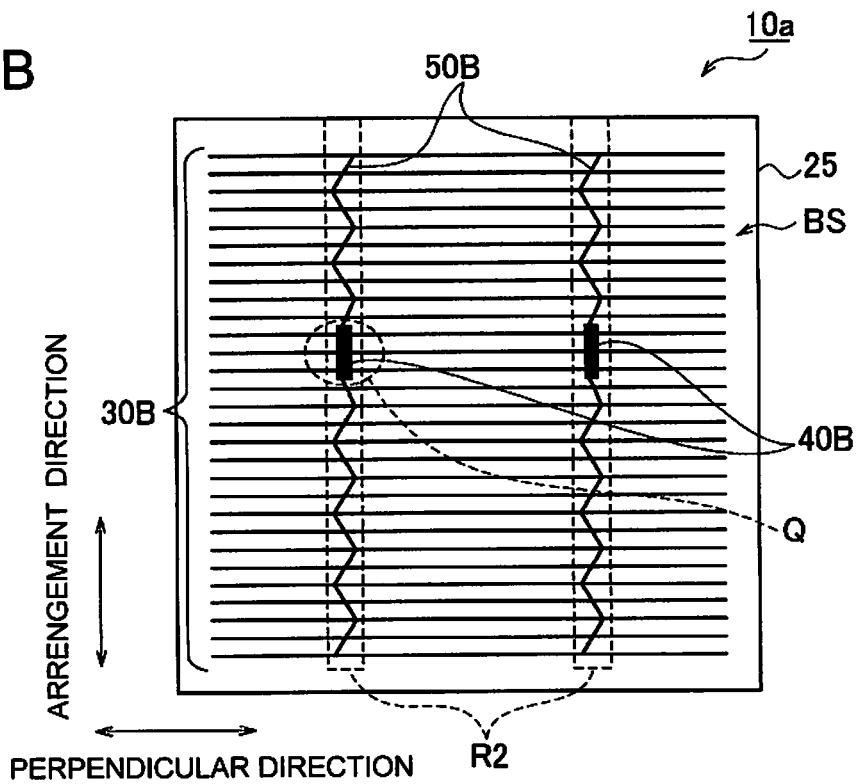

A configuration of first solar cell 10A according to the second embodiment is described with reference to FIGS. 6A and 6B. FIG. 6A is a plan view of first solar cell 10A observed from the light receiving surface side. FIG. 6B is a plan view of first solar cell 10A observed from the rear surface side.

First solar cell 10A includes first connection lines 50A and second connection lines 50B as shown in FIG. 6.

Each of first connection lines 50A is formed in a zigzag shape on light receiving surface FS of first solar cell 10A. First connection line 50A electrically connects a plurality of first fine line-shaped electrodes 30A to each other. First connection line 50A is connected to first coupling line 40A approximately in a center in the arrangement direction of light receiving surface FS.

A line width of first connection line 50A is smaller than line width $\alpha_1$ of trunk $40A_1$ of first coupling line 40A (for example, 0.5 mm). Moreover, the line width of first connection line 50A may be approximately equal to or not more than line width α₂ of branch 40A₂ (for example, 0.25 mm).

Each of second connection lines 50B is formed in a zigzag shape on rear surface BS of first solar cell 10A. Second connection line 50B electrically connects a plurality of second fine line-shaped electrodes 30B to each other. Second connection line 50B is connected to second coupling line 40B approximately in a center in the arrangement direction of rear surface BS.

The line width of second connection line 50B is smaller than line width α₃ of second coupling line 40B (for example, 0.5 mm).

Here, the line width of first connection line 50A and that of second connection line 50B is smaller than the line width of a connection electrode generally provided to connect wiring member 20 (for example, approximately 1.5 mm). The connection electrode usually has the same line width as that of wiring member 20A.

(Configuration of Second Solar Cell)

As mentioned above, each of second solar cells 10B has a structure which is upside-down from the structure of first solar cell with its front and back reversed. Accordingly, although not shown, second solar cell 10B has second connection lines 50B on light receiving surface FS, and has first connection lines 50A on rear surface BS.

(Action and Effect)

First solar cell 10A according to the second embodiment has first connection lines 50A each configured to electrically connect a plurality of first fine line-shaped electrodes 30A. Accordingly, even when first wiring member 20A peels off from the light receiving surface of first solar cell 10A, no first fine line-shaped electrode 30A is electrically isolated. As a result, deterioration in the solar cell characteristics of first solar cell 10A can be suppressed.

Moreover, the line width of first connection line 50A is smaller than the line width of the connection electrode generally used in order to connect the wiring member. Accordingly, compared with the case where a general connection electrode is formed, it is possible to suppress a warp in photoelectric conversion body 25, which is caused by a difference in the coefficient of linear expansion between a conductive material used as a material for the electrode and photoelectric conversion body 25.

First connection line 50A and a plurality of first fine line-shaped electrodes 30A intersect each other so as to form a shape of a cross, for example. When the I-V characteristics of solar cell 10 are measured, probe pins 50, 50, . . . , for current measurement are respectively contacted with intersections of first connection line 50A and the plurality of first fine line-shaped electrodes 30A. Accordingly, connection between the group of probe pins 50, 50, . . . for current measurement and the plurality of first fine line-shaped electrodes 30A can be stabilized. The above-mentioned effect can be similarly obtained by second connection lines 50B.

(Other Embodiments)

While the invention has been described with the above-mentioned embodiments, it is to be understood that the statements and drawings that make a part of this disclosure do not limit the invention. From this disclosure, various alternative embodiments, examples, and technique for implementation are apparent to persons skilled in the art.

For example, while first coupling lines 40A are formed approximately in the center in the arrangement direction of light receiving surface FS in the above-mentioned embodiments, first coupling lines 40A may be formed in an end portion in the arrangement direction of light receiving surface FS. In this case, it is possible to prevent first wiring member 20A from peeling off from an end portion of connection region R1.

Moreover, while the shape of first coupling lines 40A is different from that of second coupling lines 40B in the above-mentioned embodiments, both may have the same shape.

Moreover, while each of first coupling lines 40A electrically couples three first fine line-shaped electrodes 30A in the above-mentioned embodiment, each first coupling line 40A may electrically couple two or more first fine line-shaped electrodes 30A. In measurement of the I-V characteristics, probe pin 50 for current measurement may be contacted with one first fine line-shaped electrode 30A among first fine line-shaped electrodes 30A coupled to each other by first coupling line 40A, and probe pin 51 for voltage measurement may be contacted with another first fine line-shaped electrode 30A among first fine line-shaped electrodes 30A coupled to each other by first coupling line 40A. Similarly, second coupling line 40B may electrically couple two or more second fine line-shaped electrodes 30B to each other.

Moreover, although there is no particular description in the above-mentioned embodiments, a height of the coupling lines may be higher than that of the fine line-shaped electrodes. Thereby, electric resistance between first fine line-shaped electrode 30A₁ to first fine line-shaped electrode 30A₃ can be made smaller. As a result, a further uniform equipotential surface can be formed on the surfaces of all first fine line-shaped electrodes 30A.

Moreover, while the conductivity type of light receiving surfaces FS of first solar cells 10A is different from that of light receiving surfaces FS of second solar cells 10B in the above-mentioned embodiments, the conductivity types of both surfaces may be the same. In this case, wiring members 20 are connected to light receiving surfaces FS of first solar cells 10A and to rear surfaces BS of second solar cells 10B, respectively.

Moreover, first solar cells 10A and second solar cells 10B include first coupling line 40A and second coupling line 40B in the above-mentioned embodiment, respectively. However, only either of first coupling lines 40A and second coupling lines 40B may be included. Even in this case, the above-mentioned effect can be obtained.

Moreover, while each of solar cells 10 has a plurality of fine line-shaped electrodes also on rear surface BS in the above-mentioned embodiments, the invention is not limited to this. For example, a whole surface electrode may be formed on rear surface BS. In this case, when the four terminal measurement method is performed, one pair of probe pins 50 for current measurement and probe pin 51 for voltage measurement may be contacted with the whole surface electrode.

Moreover, while the probe pins 50, 50, . . . for current measurement are respectively contacted with all the fine line-shaped electrodes except one in the measurement of the I-V characteristics of each of solar cells 10 in the above-mentioned embodiments, the invention is not limited to this. For example, the group of probe pins 50 for current measurement may be contacted with every several electrodes of the fine line-shaped electrodes.

Moreover, while the I-V characteristics of each of solar cells 10 are measured by applying a voltage to probe pins 51 for voltage measurement in the above-mentioned embodiment, the I-V characteristics may be measured by applying a current to probe pins 50 for current measurement.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A method for measuring I-V characteristics of a solar cell, the solar cell comprising: a plurality of fine line-shaped electrodes formed on a first surface in a predetermined direction; and a coupling line formed on the first surface that electrically couples at least two fine line-shaped electrodes among the plurality of fine line-shaped electrodes, the coupling line having a line width larger than a line width of the fine line-shaped electrodes, the method comprising the steps of:
contacting a probe pin for voltage measurement with the coupling line;
contacting two or more probe pins for current measurement electrically connected to each other with two or more fine line-shaped electrodes including the fine line-shaped electrodes coupled to each other by the coupling line among the plurality of fine line-shaped electrodes; and
measuring I-V characteristics while irradiating the first surface with light.

2. The method as claimed in claim 1, further comprising contacting at least one of the probe pins for current measurement with the fine line-shaped electrodes that is not connected to the coupling line.

3. A solar cell connected to a wiring member comprising:
a first surface;
a plurality of fine line-shaped electrodes formed on the first surface and extending in a predetermined direction;
a coupling line formed on the first surface that electrically couples at least two fine line-shaped electrodes among the plurality of fine line-shaped electrodes, a line width of the fine line-shaped electrode being larger than a line width of the connection line; and
a connection line formed on the first surface that electrically connects the plurality of fine line-shaped electrodes to each other.

4. The solar cell as claimed in claim 3, wherein the coupling line and the connection line are formed in a connection region in the first surface, the connection region being a region to which the wiring member is connected.

5. The solar cell as claimed in claim 4, wherein the coupling line and the connection line are coupled to each other within the connection region.

6. The solar cell as claimed in claim 3, further comprising a connection line formed on the first surface to be electrically connected to the plurality of fine line-shaped electrodes.

7. The solar cell as claimed in claim 6, wherein a line width of the coupling line is larger than a line width of the connection line.

8. The solar cell as claimed in claim 3, wherein the line width of connection line is larger than a line width of the fine line-shaped electrode.

9. The solar cell as claimed in claim 3, wherein the coupling line is connected to the plurality of fine line-shaped electrodes except at least one fine line-shaped electrode.

10. A solar cell comprising:
a first fine line-shaped electrode group including a plurality of fine line-shaped electrodes formed on a first surface of the solar cell to extend in a predetermined direction; and
a first coupling line formed on the first surface to electrically couple at least two fine line-shaped electrodes of the first fine line-shaped electrode group, a line width of the first coupling line being larger than a line width of the fine line-shaped electrodes.

11. The solar cell as claimed in claim 10, wherein the first coupling line has an X-shape.

12. The solar cell as claimed in claim 11, wherein a line width of a trunk of the first coupling line is larger than a line width of a branch of the first coupling line.

13. The solar cell as claimed in claim 10, wherein the first coupling line has a rectangular shape.

14. The solar cell as claimed in claim 10, wherein the first coupling line has a contact portion with which a probe pin for voltage measurement is brought into contact.

15. The solar cell as claimed in claim 10, further comprising a connection line formed on the first surface to be electrically connected to the plurality of fine line-shaped electrodes.

16. The solar cell as claimed in claim 10, wherein the line width of connection line is larger than a line width of the fine line-shaped electrode.

17. The solar cell as claimed in claim 10, wherein a line width of the connection line is smaller than a line width of the first coupling line.

18. The solar cell as claimed in claim 10, further comprising:
a second fine line-shaped electrode group including a plurality of fine line-shaped electrodes formed on a second surface of the solar cell to extend in a predetermined direction, the second surface being a surface on the opposite side to the first surface;
a second coupling line formed on the second surface to electrically couple at least two fine line-shaped electrodes of the second fine line-shaped electrode group, a line width of the second coupling line being larger than a line width of the fine line-shaped electrodes.

19. The solar cell as claimed in claim 10, wherein the coupling line is connected to the plurality of fine line-shaped electrodes except at least one fine line-shaped electrode.

* * * * *